(12) United States Patent
Kusunoki et al.

(10) Patent No.: US 9,859,474 B2
(45) Date of Patent: Jan. 2, 2018

(54) ADDITION CURABLE ORGANOPOLYSILOXANE COMPOSITION, AND SEMICONDUCTOR PACKAGE

(71) Applicant: Shin-Etsu Chemical Co., Ltd., Tokyo (JP)

(72) Inventors: Takayuki Kusunoki, Annaka (JP); Hiroyuki Iguchi, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 15/235,751

(22) Filed: Aug. 12, 2016

(65) Prior Publication Data

US 2017/0051114 A1    Feb. 23, 2017

(30) Foreign Application Priority Data

Aug. 21, 2015  (JP) .................. 2015-163634

(51) Int. Cl.
| | |
|---|---|
| *C08G 77/08* | (2006.01) |
| *H01L 33/50* | (2010.01) |
| *H01L 33/56* | (2010.01) |
| *C08L 83/16* | (2006.01) |
| *C08G 77/60* | (2006.01) |
| *C08G 77/12* | (2006.01) |
| *C08G 77/20* | (2006.01) |

(52) U.S. Cl.
CPC ............ *H01L 33/502* (2013.01); *C08L 83/16* (2013.01); *H01L 33/56* (2013.01); *C08G 77/12* (2013.01); *C08G 77/20* (2013.01); *C08G 77/60* (2013.01); *C08G 2190/00* (2013.01)

(58) Field of Classification Search
CPC ...................................... C08L 83/16
See application file for complete search history.

(56) References Cited

U.S. PATENT DOCUMENTS

| | | | |
|---|---|---|---|
| 6,368,535 B1 | 4/2002 | Katsoulis et al. | |
| 7,176,270 B2 * | 2/2007 | Tabei .............. | C08G 77/50 525/478 |
| 7,452,571 B2 * | 11/2008 | Tabei .............. | C08L 83/06 257/E23.12 |
| 7,651,887 B2 | 1/2010 | Morita et al. | |
| 7,700,697 B2 * | 4/2010 | Tabei .............. | C08G 77/52 525/474 |
| 2009/0236759 A1 | 9/2009 | Kashiwagi | |
| 2015/0144987 A1 | 5/2015 | Hamamoto et al. | |

FOREIGN PATENT DOCUMENTS

| | | |
|---|---|---|
| EP | 0 913 420 A2 | 5/1999 |
| EP | 1 074 574 A1 | 2/2001 |
| EP | 1 990 367 A2 | 11/2008 |
| EP | 2 930 213 A1 | 10/2015 |
| JP | 2001-64393 A | 3/2001 |
| JP | 2005-133073 A | 5/2005 |
| JP | 2006-93354 A | 4/2006 |
| JP | 5136963 B2 | 2/2013 |
| WO | WO 2014/088115 A1 | 6/2014 |

OTHER PUBLICATIONS

Extended European Search Report dated Jan. 25, 2017, in European Patent Application No. 16182573.2.

* cited by examiner

*Primary Examiner* — Margaret Moore

(74) *Attorney, Agent, or Firm* — Birch, Stewart, Kolasch & Birch

(57) ABSTRACT

An addition curable organopolysiloxane composition comprising (A) an organopolysiloxane having at least two alkenyl groups per molecule, (B) a silphenylene oligomer having at least two silicon-bonded hydrogen atoms per molecule, and (C) a hydrosilylation catalyst cures into a product having both a satisfactory hardness and crack resistance.

5 Claims, No Drawings

ADDITION CURABLE ORGANOPOLYSILOXANE COMPOSITION, AND SEMICONDUCTOR PACKAGE

CROSS-REFERENCE TO RELATED APPLICATION

This non-provisional application claims priority under 35 U.S.C. §119(a) on Patent Application No. 2015-163634 filed in Japan on Aug. 21, 2015, the entire contents of which are hereby incorporated by reference.

TECHNICAL FIELD

This invention relates to an addition curable organopolysiloxane composition, especially comprising an organosilicon compound consisting of plural silphenylene structures within the molecule, and a semiconductor package encapsulated with the cured composition.

BACKGROUND ART

From the past, addition curable silicone resin compositions are used as encapsulant for semiconductor chips such as LED because of fast cure and heat resistance and light resistance of cured products. For example, Patent Document 1 describes an addition curable silicone resin composition which exhibits a high bond strength to LED packages of thermoplastic resins, typically PPA. Patent Document 2 describes the encapsulation of an optoelectronic chip with an addition curable silicone resin composition by compression molding.

Although addition curable silicone resin compositions are widely used as semiconductor encapsulant, their properties are still unsatisfactory. Particularly in the semiconductor encapsulant field where the encapsulating resin is stressed due to a temperature difference between the ambient environment and during current conduction, materials having crack resistance are required. Because of poor crack resistance, silicone resins are susceptible to cracking. To solve the problem, gel or rubber-like soft silicone resins are used. When semiconductor chips are encapsulated by compression molding using a compression mold or transfer mold, the gel or rubber-like silicone resins are inadequate because they are so tacky, giving rise to a stick-in-mold problem. There is a need for silicone resins which have a sufficient hardness for mold release and are yet resistant to stresses.

For imparting toughness to a cured silicone resin while maintaining hardness, an attempt to incorporate a silphenylene skeleton into a silicone resin is made in Patent Documents 3 and 4. As compared with the general method of establishing a high hardness by increasing the crosslinking density of silicone resin, this method establishes a high hardness by incorporating a silphenylene skeleton into a silicone resin to restrain motion of the polymer chain. Thus the resin has rigidity and hardness. While the method of increasing the crosslinking density generally makes the resin brittle, the method of incorporating a silphenylene skeleton is advantageous in that the resin exerts a toughness without embrittlement because the silphenylene skeleton is linear. However, a silphenylene monomer cannot be used as such because its boiling point is not so high. Prior to use, the silphenylene monomer must be modified with a siloxane or organic compound via condensation reaction or hydrosilylation reaction into a modified silphenylene compound. The siloxane-modified silphenylene skeleton-containing compound allows the softness and brittleness of siloxane to manifest whereas the organic compound-modified silphenylene skeleton-containing compound has poor heat resistance and light resistance.

CITATION LIST

Patent Document 1: JP 5136963
Patent Document 2: JP-A 2006-093354
Patent Document 3: JP-A 2001-064393
(U.S. Pat. No. 6,368,535, EP 1074574)
Patent Document 4: JP-A 2005-133073

DISCLOSURE OF INVENTION

An object of the invention is to provide an addition curable organopolysiloxane composition which cures into a product having a satisfactory hardness and crack resistance, and a semiconductor package encapsulated with the cured composition.

The inventors have found that the above and other objects are attained by adding an organosilicon compound containing a certain amount of silphenylene skeleton and having a high boiling point to an addition curable organopolysiloxane composition. Specifically, an addition curable organopolysiloxane composition comprising (A) an organopolysiloxane having at least two alkenyl groups per molecule, (B) a silphenylene oligomer having at least two silicon-bonded hydrogen atoms per molecule, represented by the formula (1) below, and (C) a hydrosilylation catalyst cures into a product having both a satisfactory hardness and crack resistance.

In one aspect, the invention provides an addition curable organopolysiloxane composition comprising
  (A) an organopolysiloxane having at least two alkenyl groups per molecule,
  (B) a silphenylene oligomer having at least two silicon-bonded hydrogen atoms per molecule, represented by the general formula (1):

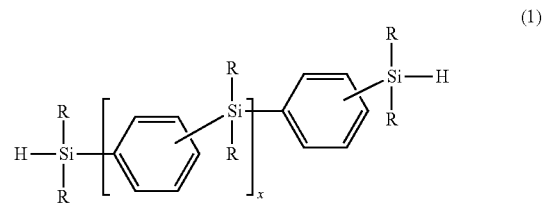

wherein R is hydrogen or a $C_1$-$C_{12}$ monovalent hydrocarbon group and x is an integer of 1 to 3, in such an amount that a ratio of the total number of silicon-bonded hydrogen atoms to the total number of alkenyl groups in component (A) is from 0.4/1 to 4/1, and
  (C) a catalytic amount of a hydrosilylation catalyst.

In a preferred embodiment, the organopolysiloxane (A) is represented by the general formula (2):

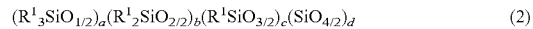

$$(R^1{}_3SiO_{1/2})_a(R^1{}_2SiO_{2/2})_b(R^1SiO_{3/2})_c(SiO_{4/2})_d \qquad (2)$$

wherein $R^1$ is a $C_1$-$C_{12}$ monovalent saturated aliphatic hydrocarbon group, $C_6$-$C_{12}$ monovalent aromatic hydrocarbon group, or $C_2$-$C_6$ alkenyl group, at least two of $R^1$ groups being alkenyl, a is an integer of 0 to 100, b is an integer of 0 to 1,000, c is an integer of 0 to 500, d is an integer of 0 to 500, and $2 \leq a+b+c+d \leq 1,000$. In formula (2), preferably aryl accounts for 5 to 90% of the total number of $R^1$ groups.

In a preferred embodiment, the organopolysiloxane (A) contains a branched organopolysiloxane.

A semiconductor package encapsulated with a cured product of the addition curable organopolysiloxane composition defined above is also provided.

Advantageous Effects of Invention

The addition curable organopolysiloxane composition comprising a silphenylene oligomer containing repeating silphenylene skeletons has toughness because the linear molecular chain becomes more rigid and is extended as compared with the use of a silphenylene monomer.

DESCRIPTION OF PREFERRED EMBODIMENTS

The notation (Cn-Cm) means a group containing from n to m carbon atoms per group.
(A) Alkenyl-Containing Organopolysiloxane Component (A) is an organopolysiloxane having at least two alkenyl groups per molecule, which is not particularly limited and may be used alone or in admixture of two or more. Preferably, it is an organopolysiloxane having at least two alkenyl groups per molecule, represented by the general formula (2).

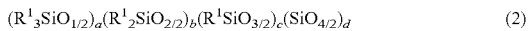

$$(R^1_3SiO_{1/2})_a(R^1_2SiO_{2/2})_b(R^1SiO_{3/2})_c(SiO_{4/2})_d \quad (2)$$

Herein $R^1$ is a $C_1$-$C_{12}$ monovalent saturated aliphatic hydrocarbon group, $C_6$-$C_{12}$ monovalent aromatic hydrocarbon group, or $C_2$-$C_6$ alkenyl group, at least two of $R^1$ groups being alkenyl, a is an integer of 0 to 100, b is an integer of 0 to 1,000, c is an integer of 0 to 500, d is an integer of 0 to 500, and $2 \leq a+b+c+d \leq 1,000$.

In formula (2), examples of group $R^1$ include $C_1$-$C_{12}$ monovalent saturated aliphatic hydrocarbon groups, for example, alkyl groups such as methyl, ethyl, propyl, butyl and hexyl, and cycloalkyl groups such as cyclohexyl, $C_6$-$C_{12}$ monovalent aromatic hydrocarbon groups, for example, aryl groups such as phenyl, tolyl, xylyl and naphthyl and aralkyl groups such as benzyl, phenylethyl and phenylpropyl, and $C_2$-$C_6$ alkenyl groups such as vinyl, allyl and propenyl. At least two of $R^1$ groups are alkenyl, preferably vinyl. Methyl and phenyl are preferred as $R^1$ other than alkenyl.

The organopolysiloxane should have at least two alkenyl groups per molecule. An alkenyl content is preferably 0.005 to 0.5 mol/100 g, more preferably 0.01 to 0.2 mol/100 g of the organopolysiloxane. The alkenyl groups may be present in any of $R^1_3SiO_{1/2}$ units, $R^1_2SiO_{2/2}$ units and $R^1SiO_{3/2}$ units or in plural units, preferably in $R^1_3SiO_{1/2}$ units.

Also preferably, aryl account for 5 to 90%, more preferably 5 to 70%, and even more preferably 5 to 55% of the total number of $R^1$ groups in formula (2). As a result of inclusion of aryl in the organopolysiloxane, gas barrier properties and compatibility with component (B) are improved, and a highly transparent cured resin is available.

In formula (2), a is an integer of 0 to 100, preferably 0 to 75, and more preferably 0 to 50; b is an integer of 0 to 1,000, preferably 0 to 500, and more preferably 0 to 250; c is an integer of 0 to 500, preferably 0 to 250, and more preferably 0 to 125, d is an integer of 0 to 500, preferably 0 to 250, and more preferably 0 to 125; and $2 \leq a+b+c+d \leq 1,000$, preferably $5 \leq a+b+c+d \leq 750$, and more preferably $10 \leq a+b+c+d \leq 500$.

Preferably component (A) contains a branched organopolysiloxane. The branched organopolysiloxane is preferably one having formula (2) wherein c and d are integers in the range: $5 \leq c+d \leq 750$, more preferably $10 \leq c+d \leq 500$. Component (A) is preferably a mixture of a branched organopolysiloxane and a linear organopolysiloxane, specifically in a weight ratio of from 100:5 to 100:100, especially from 100:10 to 100:50.

The organopolysiloxane may be prepared by any well-known methods while a commercially available organopolysiloxane may also be used.
(B) Silphenylene Oligomer Component (B) is a silphenylene oligomer having at least two silicon-bonded hydrogen atoms per molecule, represented by the general formula (1):

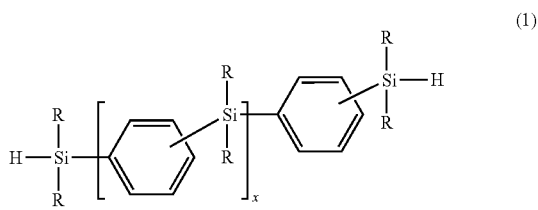

wherein R is hydrogen or a $C_1$-$C_{12}$ monovalent hydrocarbon group and x is an integer of 1 to 3.

In formula (1), R is hydrogen or a $C_1$-$C_{12}$ monovalent hydrocarbon group. The monovalent hydrocarbon group is preferably free of aliphatic unsaturation. Examples of the monovalent hydrocarbon group include alkyl groups such as methyl, ethyl, propyl, butyl, pentyl, hexyl and octyl, cycloalkyl groups such as cyclohexyl, aryl groups such as phenyl, tolyl, xylyl, and naphthyl, and aralkyl groups such as benzyl, phenylethyl and phenylpropyl. Inter alia, methyl is preferred as R. The subscript x is an integer of 1 to 3, preferably 1.

At least two silicon-bonded hydrogen atoms (i.e., SiH groups) are included in the molecule. A SiH content is preferably 0.15 to 3 mol/100 g, more preferably 0.3 to 1 mol/100 g of the oligomer.

Component (B) is blended with component (A) in such amounts that a ratio of the total number of SiH groups in component (B) to the total number of alkenyl groups in component (A) ranges from 0.4/1 to 4/1, preferably from 0.6/1 to 2.5/1, and more preferably from 0.8/1 to 2.2/1. A ratio below the lower limit indicates shortage of SiH groups and under-cure. Above the upper limit, residual SiH groups tend to induce side reactions such as dehydrogenation.
(C) Hydrosilylation Catalyst Component (C) is a hydrosilylation catalyst. The catalyst is not particularly limited and may be selected from well-known ones. Preferred are platinum group metal elements and platinum group metal compounds. Suitable catalysts include platinum base catalysts such as platinum (inclusive of platinum black), platinum chloride, chloroplatinic acid, platinum-olefin complexes such as platinum-divinylsiloxane complex, and platinum-carbonyl complexes, palladium base catalysts and rhodium base catalysts. These catalysts may be used alone or in admixture. Inter alia, chloroplatinic acid and platinum-olefin complexes such as platinum-divinylsiloxane complex are preferred.

The amount of component (C) used is not particularly limited and may be a catalytic amount. The catalytic amount is a sufficient amount for addition reaction to take place and may be determined as appropriate in accordance with the desired cure rate. In an example where the platinum group metal compound is used, it is preferred from the standpoint of reaction rate that the catalyst be used in such an amount as to provide 0.1 to 50 ppm, more preferably 1 to 10 ppm of platinum group metal based on the total weight of components (A) and (B).

In addition to the above components (A) to (C), the addition curable organopolysiloxane composition may include optional additives such as phosphor, inorganic filler, adhesive aid, and cure inhibitor. These additives are described below.

Phosphor

The phosphor used herein is not particularly limited and any well-known phosphors may be used. One preferred example is the phosphor capable of absorbing light from a semiconductor chip, typically a semiconductor LED including a light-emissive layer of nitride semiconductor and converting it to light of different wavelength. Suitable such phosphors include nitride base phosphors and oxynitride base phosphors which are activated mainly with a lanthanoid element such as Eu or Ce; alkaline earth metal halide apatite phosphors which are activated mainly with a lanthanoid element such as Eu or a transition metal element such as Mn, alkaline earth metal borate halide phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, and germanate phosphors; rare earth aluminate phosphors which are activated mainly with a lanthanoid element such as Ce; rare earth silicate phosphors; organic and organic complex phosphors which are activated mainly with a lanthanoid element such as Eu; and Ca—Al—Si—O—N oxynitride glass phosphors, which may be used alone or in admixture.

Exemplary of the nitride phosphors which are activated mainly with a lanthanoid element such as Eu or Ce are $M_2Si_5N_8$:Eu wherein M is at least one element selected from Sr, Ca, Ba, Mg, and Zn. Also included are $MSi_7N_{10}$:Eu, $M_{1.8}Si_5O_{0.2}N_8$:Eu, and $M_{0.9}Si_7O_{0.1}N_{10}$:Eu wherein M is at least one element selected from Sr, Ca, Ba, Mg, and Zn.

Exemplary of the oxynitride phosphors which are activated mainly with a lanthanoid element such as Eu or Ce are $MSi_2O_2N_2$:Eu wherein M is at least one element selected from Sr, Ca, Ba, Mg, and Zn.

Exemplary of the alkaline earth metal halide apatite phosphors which are activated mainly with a lanthanoid element such as Eu or a transition metal element such as Mn are $M_5(PO_4)_3X$:R' wherein M is at least one element selected from Sr, Ca, Ba, Mg, and Zn, X is at least one element selected from F, Cl, Br and I, and R' is Eu, Mn, or Eu and Mn.

Exemplary of the alkaline earth metal borate halide phosphors are $M_2B_5O_9X$:R' wherein M is at least one element selected from Sr, Ca, Ba, Mg, and Zn, X is at least one element selected from F, Cl, Br and I, and R' is Eu, Mn, or Eu and Mn.

Exemplary of the alkaline earth metal aluminate phosphors are $SrAl_2O_4$:R', $Sr_4Al_{14}O_{25}$:R', $CaAl_2O_4$:R', $BaMg_2Al_{16}O_{27}$:R', $BaMg_2Al_{16}O_{12}$:R' and $BaMgAl_{10}O_{17}$:R' wherein R' is Eu, Mn, or Eu and Mn.

Exemplary of the alkaline earth metal sulfide phosphors are $La_2O_2S$:Eu, $Y_2O_2S$:Eu and $Gd_2O_2S$:Eu.

Exemplary of the rare earth aluminate phosphors which are activated mainly with a lanthanoid element such as Ce are YAG base phosphors of the compositional formulae: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$:Ce. Also included are variants of the foregoing wherein Y is partly or entirely replaced by Tb or Lu, such as $Tb_3Al_5O_{12}$:Ce and $Lu_3Al_5O_{12}$:Ce.

Other suitable phosphors include ZnS:Eu, $Zn_2GeO_4$:Mn, and $MGa_2S_4$:Eu wherein M is at least one element selected from Sr, Ca, Ba, Mg, and Zn.

In the above phosphors, at least one element selected from Tb, Cu, Ag, Au, Cr, Nd, Dy, Co, Ni and Ti may be incorporated instead of Eu or in addition to Eu, if desired.

The Ca—Al—Si—O—N oxynitride glass phosphors are phosphors based on an oxynitride glass matrix consisting of 20 to 50 mol % of $CaCO_3$ (calculated as CaO), 0 to 30 mol % of $Al_2O_3$, 25 to 60 mol % of $SiO$, 5 to 50 mol % of AlN, and 0.1 to 20 mol % of a rare earth oxide or transition metal oxide, the total of five ingredients being 100 mol %. In the phosphors based on an oxynitride glass matrix, the nitrogen content is preferably up to 15 mol %, and besides the rare earth oxide ion, another rare earth ion serving as a sensitizer is preferably contained in the phosphor glass in a content of 0.1 to 10 mol % of rare earth oxide as a co-activator.

Phosphors other than the foregoing may also be used as long as they have equivalent functions and effects.

The phosphor takes the form of particles having an average particle size of preferably at least 10 nm, more preferably 10 nm to 10 μm, and even more preferably 10 nm to 1 μm. Notably, the average particle size is measured by a particle size distribution measurement system CILAS using the laser light diffraction method.

When added, the amount of the phosphor is preferably 0.1 to 2,000 parts, more preferably 0.1 to 100 parts by weight per 100 parts by weight of the other components, typically components (A) to (C) combined. When the cured product of the addition curable organopolysiloxane composition takes the form of a phosphor-containing film for wavelength conversion, the phosphor amount is preferably 10 to 2,000 parts by weight.

Inorganic Filler

Suitable inorganic fillers include silica, fumed silica, fumed titanium dioxide, alumina, calcium carbonate, calcium silicate, titanium dioxide, ferric oxide, and zinc oxide, which may be used alone or in admixture. When added, the amount of the filler is preferably up to 20 parts, more preferably 0.1 to 10 parts by weight per 100 parts by weight of components (A) to (C) combined, but not limited thereto.

Adhesive Aid

An adhesive aid may be added to the organopolysiloxane composition for imparting adhesion thereto, if desired. Suitable adhesive aids are organosiloxane oligomers of preferably 4 to 50 silicon atoms, more preferably 4 to 20 silicon atoms, having at least one substituent selected from silicon-bonded hydrogen and alkenyl and at least one of hydroxysilyl group, alkoxy group, epoxy group and nitrogen-containing substituent. These oligomers differ from component (A) in that they contain a hydroxysilyl group, alkoxy group, epoxy group or nitrogen-containing substituent.

Also useful as the adhesive aid are organooxysilyl-modified isocyanurate compounds having the formula (3) below and hydrolytic condensates thereof (i.e., organosiloxane-modified isocyanurate compounds).

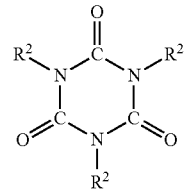

(3)

In formula (3), $R^2$ is each independently an organic group having the formula (4) below, or a monovalent unsaturated aliphatic hydrocarbon group, with the proviso that at least one $R^2$ is an organic group of formula (4).

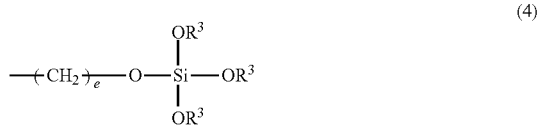

(4)

Herein $R^3$ is hydrogen or a $C_1$-$C_6$ monovalent hydrocarbon group such as methyl or ethyl, and e is an integer of 1 to 6, preferably 1 to 4.

In formula (3), the monovalent unsaturated aliphatic hydrocarbon group represented by $R^2$ may optionally contain oxygen, and is preferably selected from hydrocarbon groups of 2 to 8 carbon atoms, more preferably 2 to 6 carbon atoms, for example, linear or branched alkenyl groups such as vinyl, allyl, 1-butenyl, 1-hexenyl and 2-methylpropenyl, and (meth)acrylic groups.

When added, the amount of the adhesive aid is preferably up to 10 parts, more preferably 0.1 to 8 parts, and even more preferably 0.2 to 5 parts by weight per 100 parts by weight of components (A) to (C) combined. As long as the amount is equal to or less than the upper limit, the cured product has a high hardness and a less surface tack.

The adhesive aid is preferably added in such amounts that the ratio of the total number of hydrosilyl groups in the entire composition (inclusive of the adhesive aid) to the total number of alkenyl groups in the entire composition may be in a range from 0.4/1 to 4/1, more preferably 0.6/1 to 3/1, and even more preferably 0.8/1 to 2/1.

Further the adhesive aid is preferably added in an amount of 0.01 to 10%, more preferably 0.1 to 5% by weight based on the total weight of components (A) and (B). This range of the adhesive aid is effective for improving the adhesion of the composition without sacrificing its benefits.

Cure Inhibitor

A cure inhibitor may be added to the organopolysiloxane composition for controlling reactivity to enhance shelf stability, if desired. Suitable cure inhibitors include triallyl isocyanurate, alkyl maleates, acetylene alcohols, silane or siloxane-modified products thereof, hydroperoxide, tetramethylethylenediamine, benzotriazole, and mixtures thereof. When added, the amount of the cure inhibitor is preferably 0.001 to 1 part, more preferably 0.005 to 0.5 part by weight per 100 parts by weight of components (A) to (C) combined.

Other Additives

Besides the above components, other additives may be added to the organopolysiloxane composition. Suitable additives include an antidegradant, radical scavenger, flame retardant, surfactant, ozone degradation inhibitor, photostabilizer, thickener, plasticizer, antioxidant, heat stabilizer, conductive agent, antistatic agent, radiation shielding agent, nucleating agent, phosphorus peroxide decomposing agent, lubricant, pigment, metal inactivating agent, physical property regulator, and organic solvent. These optional additives may be used alone or in admixture.

The simplest embodiment of the addition curable organopolysiloxane composition is a composition consisting of components (A), (B) and (C). Particularly when it is desired that a cured product have high transparency, the composition should preferably be free of an inorganic filler such as silica filler. Examples of the inorganic filler are as described above.

The method for preparing the addition curable organopolysiloxane composition is not particularly limited. The composition may be prepared by any prior art well-known methods, for example, by mixing components (A), (B), (C), and optional components in a standard way. For example, the components are fed into a commercially available mixer (e.g., Thinky Conditioning Mixer by Thinky Corp.) where they are mixed for about 1 to 5 minutes until uniform.

The method for curing the addition curable organopolysiloxane composition is not particularly limited. The composition may be cured by any prior art well-known methods, for example, by heating at 60 to 180° C. for about 1 to 12 hours. Preferably the composition is cured stepwise. The stepwise curing includes two steps, for example. The organopolysiloxane composition is heated at a temperature of 60 to 100° C. for 0.5 to 2 hours for achieving full deaeration before it is heated at a temperature of 120 to 180° C. for 1 to 10 hours for heat curing. Such stepwise curing ensures that even when the composition to be cured is thick walled, it is fully cured into a colorless transparent product without bubbles. The term "colorless transparent product" means that a cured part of 1 mm thick has a light transmittance of at least 80%, preferably at least 85%, and most preferably at least 90% at wavelength 450 nm.

Since the addition curable organopolysiloxane composition cures into a product having a high light transmittance, it is suited for the encapsulation of LED chips, especially blue and purple LED chips. An LED chip or microelectronic device may be encapsulated with the addition curable organopolysiloxane composition by any prior art well-known methods, for example, dispensing or compression molding.

Since the addition curable organopolysiloxane composition cures into a product having crack resistance, heat resistance, light resistance and transparency, it is also suited in a variety of applications including display materials, optical recording media materials, optical equipment materials, optical part materials, optical fiber materials, optoelectronic functional organic materials, and semiconductor IC-related materials.

EXAMPLE

Examples of the invention are given below by way of illustration and not by way of limitation. In Examples, all parts are by weight (pbw) unless otherwise indicated. A weight average molecular weight (Mw) was measured by gel permeation chromatography (GPC) versus polystyrene standards under the following conditions.

GPC Analysis Conditions
Developing solvent: tetrahydrofuran (THF)
Flow rate: 0.6 mL/min
Column: TSK Guardcolumn SuperH-L
  TSKgel SuperH4000 (6.0 mm ID×15 cm×1)
  TSKgel SuperH3000 (6.0 mm ID×15 cm×1)
  TSKgel SuperH2000 (6.0 mm ID×15 cm×2)
  (all Tosoh Corp.)
Column temperature: 40° C.
Sample injection volume:
  20 μL (sample concentration: 0.5 wt % THF solution)
Detector: differential refractive index (RI) detector
Proton nuclear magnetic resonance ($^1$H-NMR) spectra were measured on a spectrometer ULTRASHIELD® 400PLUS (Bruker).

The Vi value (mol/100 g) and SiH value (mol/100 g) shown below were determined by measuring a $^1$H-NMR spectrum of the compound at 400 MHz, and computing integrated values of hydrogen atoms using dimethyl sulfoxide as internal standard. Vi stands for vinyl.

Components (A), (B) and (C) used in Examples have the following structures.

(A-1) Phenyl-base silicone resin of the formula below
 (Shin-Etsu Chemical Co., Ltd., Vi value=0.147 mol/100 g, Mw=1,563)

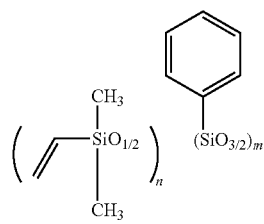

number ratio of n units to m units=0.22:0.78

(A-2) Both end vinyl-capped phenyl-base silicone oil of the formula below
 (Shin-Etsu Chemical Co., Ltd., Vi value=0.038 mol/100 g, Mw=5,729)

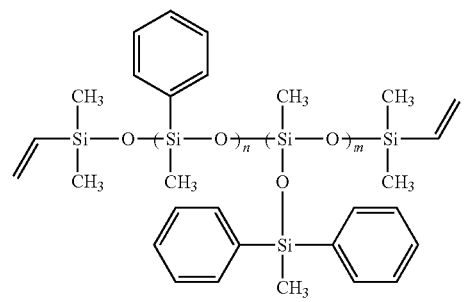

number ratio of n units to m units=0.03:0.97

(A-3) Both end vinyl-capped phenyl-base silicone oil of the formula below
 (Shin-Etsu Chemical Co., Ltd., Vi value=0.038 mol/100 g, Mw=5,562)

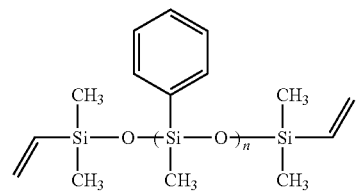

n=38 (average)

(A-4) Both end vinyl-capped organopolysiloxane of the formula below
 (Shin-Etsu Chemical Co., Ltd., Vi value=0.022 mol/100 g, Mw=9,192)

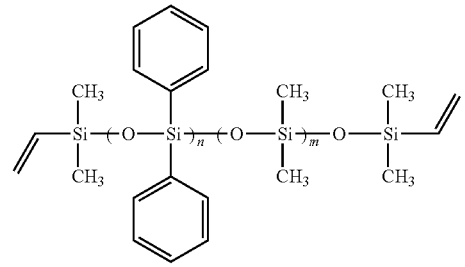

number ratio of n units to m units=0.055:0.945

(B-1) Silphenylene oligomer of the formula below
 (Shin-Etsu Chemical Co., Ltd., SiH value=0.61 mol/100 g, Mw=352)

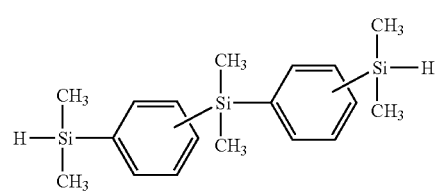

(B-2) Silphenylene oligomer of the formula below
 (Shin-Etsu Chemical Co., Ltd., SiH value=0.43 mol/100 g, Mw=465)

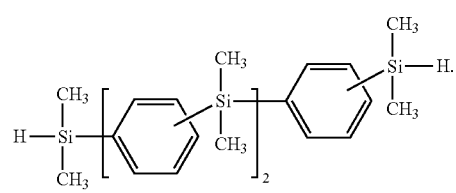

(B'-1) Silphenylene monomer of the formula below
 (Shin-Etsu Chemical Co., Ltd., SiH value=1.03 mol/100 g, Mw=202)

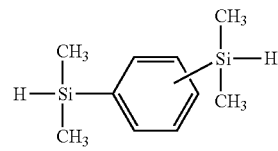

(B'-2) Both end hydrosilyl-capped linear organopolysiloxane of the formula below
 (Shin-Etsu Chemical Co., Ltd., SiH value=0.44 mol/100 g, Mw=536)

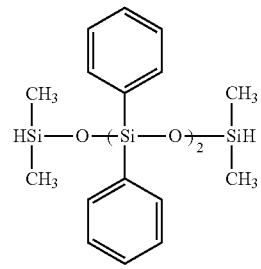

(C) Divinylsiloxane complex of chloroplatinic acid
 (Shin-Etsu Chemical Co., Ltd., platinum content 2 wt %)

Examples 1 to 6 and Comparative Examples 1 to 3

Organopolysiloxane compositions were prepared by mixing the components exclusive of the catalyst in the amounts shown in Table 1, adding an amount of the catalyst so as to give 2 ppm of platinum based on the total weight of the composition, and further mixing them. These organopolysiloxane compositions were examined by the following tests. In Table 1, the value of H/Vi is a ratio of the total number of hydrosilyl groups to the total number of vinyl groups in the overall composition.

(1) Viscosity of Organopolysiloxane Composition

A viscosity at 23° C. of the organopolysiloxane composition was measured according to JIS Z 8803:2011 by a Brookfield viscometer.

(2) Volatile and Non-Volatile Contents of Organopolysiloxane Composition

The organopolysiloxane composition was weighed ~1.5 g, cast into an aluminum dish of 50 mm diameter and 10 mm thick, and cured at 150° C. for 1 hour. The weight of the composition was measured before and after heat curing. From a weight loss after heat curing, a weight of volatile component and a weight of non-volatile cured component were calculated. The volatile content and the non-volatile content calculated from the weight loss are expressed in % based on the weight of the organopolysiloxane composition before heat curing which is 100%.

(3) Hardness of Cured Product

The organopolysiloxane composition was cast into an aluminum dish of 50 mm diameter and 10 mm thick, and cured stepwise at 60° C. for 1 hour, at 100° C. for 1 hour, and at 150° C. for 4 hours into a cured product. The cured product was measured for Shore D hardness according to JIS K 6253-3:2012.

(4) Light Transmittance of Cured Product

A concave polytetrafluoroethylene spacer of 1 mm thick was sandwiched between two slide glass plates of 50 mm×20 mm×1 mm thick and fixedly secured. The organopolysiloxane composition was cast into the space, and cured stepwise at 60° C. for 1 hour, at 100° C. for 1 hour, and at 150° C. for 4 hours. The cured sample was measured for light transmittance at wavelength 450 nm on a spectrometer U-4100 (Hitachi High-Technologies Corp.).

(5) Tensile Strength and Elongation at Break of Cured Product

The organopolysiloxane composition was cast into a concave polytetrafluoroethylene mold of 150 mm×200 mm×2 mm thick and cured stepwise at 60° C. for 1 hour, at 100° C. for 1 hour, and at 150° C. for 4 hours. The cured sample was measured for tensile strength and elongation at break on a tensile tester EZ TEST (EZ-L by Shimadzu Corp.) according to JIS K 6251:2010 under conditions including a separation rate of 500 mm/min, a distance between grips of 80 mm, and a distance between two gage marks of 40 mm.

(6) Thermal Cycling Test

The organopolysiloxane composition was dispensed on a package (Tiger 3528, Shin-Etsu Chemical Co., Ltd.) and cured stepwise at 60° C. for 1 hour, at 100° C. for 1 hour, and at 150° C. for 4 hours, obtaining a test sample in the form of the package encapsulated with the cured product. On twenty test samples, a thermal cycling test (TCT) between −50° C. and 140° C. was carried out over 1,000 cycles. The number of test samples in which the encapsulant cracked was counted.

The test results are shown in Table 2.

TABLE 1

|       |       | Example |     |     |     |     |     | Comparative Example |     |     |
|-------|-------|---------|-----|-----|-----|-----|-----|---------------------|-----|-----|
|       |       | 1       | 2   | 3   | 4   | 5   | 6   | 1                   | 2   | 3   |
| (A)*  | (A-1) | 100     | 100 | 100 | 100 | 100 | 100 | 100                 | 100 | 100 |
|       | (A-2) | 50      | 30  | 10  | 25  | —   | —   | 50                  | 30  | 50  |
|       | (A-3) | —       | —   | —   | —   | 50  | —   | —                   | —   | —   |
|       | (A-4) | —       | —   | —   | —   | —   | 25  | —                   | —   | —   |
| (B)*  | (B-1) | 27.2    | 44.2| 76.7| 12.8| —   | 55  | —                   | —   | —   |
|       | (B-2) | —       | —   | —   | —   | 27  | —   | —                   | —   | —   |
|       | (B'-1)| —       | —   | —   | —   | —   | —   | 16.1                | 26.1| —   |
|       | (B'-2)| —       | —   | —   | —   | —   | —   | —                   | —   | 37.4|
| (C)   |       | 2 ppm of Pt in composition |||||||||
| H/Vi  |       | 1.0     | 1.7 | 3.1 | 0.5 | 0.7 | 2.2 | 1.0                 | 1.7 | 1.0 |

*unit: pbw

TABLE 2

Test results

|               |              |      | Example |      |      |      |      |      | Comparative Example |      |      |
|---------------|--------------|------|---------|------|------|------|------|------|---------------------|------|------|
| Test item     | Conditions   | Unit | 1       | 2    | 3    | 4    | 5    | 6    | 1                   | 2    | 3    |
| Viscosity     | 23° C.       | Pa·s | 3.8     | 2.8  | 1.6  | 20.4 | 6.3  | 2.4  | 4                   | 2.9  | 3.6  |
| Non-volatile content | 150° C./1 hr | %    | 99.5 | 99.4 | 99.4 | 99.6 | 99.7 | 99.4 | 94.9 | 89.7 | 99.4 |
| Volatile content | 150° C./1 hr | %    | 0.5  | 0.6  | 0.6  | 0.4  | 0.3  | 0.6  | 5.1  | 10.3 | 0.6  |
| Hardness      | Shore D      | —    | 51      | 44   | 21   | 42   | 55   | 41   | 26                  | 33   | 25   |
| Transmittance | 1 mm thick, 450 nm | % T | 99.8 | 99.7 | 99.8 | 99.8 | 99.6 | 99.7 | 99.7 | 99.8 | 99.6 |

TABLE 2-continued

| | | | Example | | | | | | Comparative Example | | |
|---|---|---|---|---|---|---|---|---|---|---|---|
| Test item | Conditions | Unit | 1 | 2 | 3 | 4 | 5 | 6 | 1 | 2 | 3 |
| Tensile strength | 25° C. | MPa | 6.6 | 5.9 | 4.8 | 5.4 | 7.1 | 5.6 | 2.1 | 3.2 | 3.4 |
| Elongation at break | 25° C. | % | 100 | 130 | 170 | 140 | 70 | 130 | 50 | 40 | 60 |
| TCT | −50° C. ↔ 140° C. 1,000 cycles | number of cracked samples | 0/20 | 0/20 | 0/20 | 0/20 | 0/20 | 0/20 | 18/20 | 16/20 | 20/20 |

As seen from Table 2, organopolysiloxane compositions containing a silphenylene oligomer (Examples 1 to 6) have a low volatile content and cure into products which are hard, but have acceptable elongation and satisfactory mechanical strength. In contrast, organopolysiloxane compositions containing a silphenylene monomer (Comparative Examples 1 and 2) have a high volatile content originating from the monomer, and their cured products have a composition deviated from the original and are brittle. An organopolysiloxane compositions containing both end hydrosilyl-capped linear organopolysiloxane (Comparative Example 3) has a low volatile content, but its cured product shows insufficient tensile strength and elongation at break, and poor crack resistance in the TCT.

It has been demonstrated that the organopolysiloxane composition containing a specific silphenylene oligomer imparts rigidity and toughness to its cured product.

The addition curable organopolysiloxane composition containing a silphenylene oligomer according to the invention cures into a product having satisfactory mechanical properties. By encapsulating a semiconductor chip with the cured organopolysiloxane composition, a fully reliable semiconductor package is obtained. Since the cured product has high light transmittance, the organopolysiloxane composition is best suited for the encapsulation of LED chips, especially blue and purple LED chips.

Japanese Patent Application No. 2015-163634 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An addition curable organopolysiloxane composition comprising
(A) an organopolysiloxane having at least two alkenyl groups per molecule,
(B) a silphenylene oligomer having at least two silicon-bonded hydrogen atoms per molecule, represented by the general formula (1):

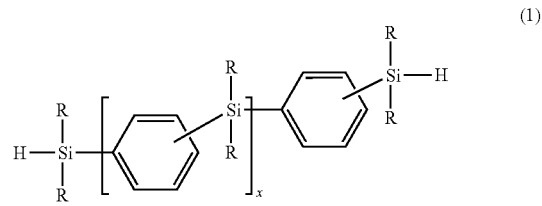

(1)

wherein R is hydrogen or a $C_1$-$C_{12}$ monovalent hydrocarbon group and x is an integer of 1 to 3, in such an amount that a ratio of the total number of silicon-bonded hydrogen atoms to the total number of alkenyl groups in component (A) is from 0.4/1 to 4/1, and
(C) a catalytic amount of a hydrosilylation catalyst.

2. The organopolysiloxane composition of claim 1 wherein the organopolysiloxane (A) is represented by the general formula (2):

$$(R^1{}_3SiO_{1/2})_a(R^1{}_2SiO_{2/2})_b(R^1SiO_{3/2})_c(SiO_{4/2})_d \quad (2)$$

wherein $R^1$ is a $C_1$-$C_{12}$ monovalent saturated aliphatic hydrocarbon group, $C_6$-$C_{12}$ monovalent aromatic hydrocarbon group, or $C_2$-$C_6$ alkenyl group, at least two of $R^1$ groups being alkenyl, a is an integer of 0 to 100, b is an integer of 0 to 1,000, c is an integer of 0 to 500, d is an integer of 0 to 500, and 2≤a+b+c+d≤1,000.

3. The organopolysiloxane composition of claim 2 wherein in formula (2), aryl accounts for 5 to 90% of the total number of $R^1$ groups.

4. The organopolysiloxane composition of claim 1 wherein the organopolysiloxane (A) contains a branched organopolysiloxane.

5. A semiconductor package encapsulated with a cured product of the addition curable organopolysiloxane composition of claim 1.

* * * * *